(12) United States Patent
Chauhan et al.

(10) Patent No.: US 11,694,165 B2
(45) Date of Patent: Jul. 4, 2023

(54) KEY-VALUE MEMORY NETWORK FOR PREDICTING TIME-SERIES METRICS OF TARGET ENTITIES

(71) Applicant: Adobe Inc., San Jose, CA (US)

(72) Inventors: Ayush Chauhan, Bangalore (IN); Shiv Kumar Saini, Bangalore (IN); Parth Gupta, Roorkee (IN); Archiki Prasad, Mumbai (IN); Amireddy Prashanth Reddy, Nalgonda (IN); Ritwick Chaudhry, Chandigarh (IN)

(73) Assignee: Adobe Inc., San Jose, CA (US)

( * ) Notice: Subject to any disclaimer, the term of this patent is extended or adjusted under 35 U.S.C. 154(b) by 0 days.

(21) Appl. No.: 17/960,585

(22) Filed: Oct. 5, 2022

(65) Prior Publication Data

US 2023/0031050 A1 Feb. 2, 2023

Related U.S. Application Data

(62) Division of application No. 16/868,942, filed on May 7, 2020, now Pat. No. 11,501,107.

(51) Int. Cl.
*G06F 18/214* (2023.01)
*G06N 3/063* (2023.01)
(Continued)

(52) U.S. Cl.
CPC ............ *G06F 18/214* (2023.01); *G06F 18/24* (2023.01); *G06N 3/063* (2013.01); *G06F 7/5443* (2013.01); *G06Q 10/109* (2013.01); *G11C 16/14* (2013.01)

(58) Field of Classification Search
CPC .. G06K 9/6256; G06K 9/6267; G06K 9/6262; G06K 9/627; G06K 9/6271;
(Continued)

(56) References Cited

U.S. PATENT DOCUMENTS 10,311,337 B1 6/2019 Kim et al.
10,846,870 B2 11/2020 Zhang et al.
(Continued)

OTHER PUBLICATIONS

"Amazon SageMaker", Developer Guide, Available Online At: https://docs.aws.amazon.com/sagemaker/latest/dg/deepar.html, 2020, 885 pages.
(Continued)

*Primary Examiner* — Michael S Osinski
(74) *Attorney, Agent, or Firm* — Kilpatrick Townsend & Stockton LLP (57) ABSTRACT

A system implements a key value memory network including a key matrix with key vectors learned from training static feature data and time-series feature data, a value matrix with value vectors representing time-series trends, and an input layer to receive, for a target entity, input data comprising a concatenation of static feature data of the target entity, time-specific feature data, and time-series feature data for the target entity. The key value memory network also includes an entity-embedding layer to generate an input vector from the input data, a key-addressing layer to generate a weight vector indicating similarities between the key vectors and the input vector, a value-reading layer to compute a context vector from the weight and value vectors, and an output layer to generate predicted time-series data for a target metric of the target entity by applying a continuous activation function to the context vector and the input vector.

20 Claims, 5 Drawing Sheets

(51) Int. Cl.
G06F 18/24 (2023.01)
G11C 16/14 (2006.01)
G06Q 10/109 (2023.01)
G06F 7/544 (2006.01)

(58) Field of Classification Search
CPC .......... G06N 3/063; G06N 3/04; G06N 3/084;
G06N 3/08; G06N 3/0454; G06N 3/02;
G06N 20/00; G06N 7/005; G06F 7/5443;
G06F 18/214; G06F 18/24; G06Q 10/109;
G11C 16/14; G06T 2207/20084; G06T
2207/20081; G06T 3/0012; G06T 7/11;
G06T 11/00; G06T 3/0093; G06V 10/82;
G06V 10/454; G06V 10/40; G06V
10/764; G06V 20/56
See application file for complete search history.

(56) References Cited

U.S. PATENT DOCUMENTS

| | | | |
|---|---|---|---|
| 11,017,210 | B2 | 5/2021 | Thodberg |
| 2016/0300121 | A1 | 10/2016 | Chertok et al. |
| 2018/0260956 | A1 | 9/2018 | Huang et al. |
| 2019/0130215 | A1 | 5/2019 | Kaestle et al. |
| 2019/0220746 | A1 | 7/2019 | Liu et al. |
| 2020/0342570 | A1 | 10/2020 | Yuan et al. |
| 2020/0410751 | A1 | 12/2020 | Omari et al. |
| 2021/0174133 | A1 | 6/2021 | Nitsch et al. |
| 2021/0233214 | A1 | 7/2021 | Liu et al. |
| 2021/0241091 | A1 | 8/2021 | Neumann |
| 2021/0303970 | A1* | 9/2021 | Ma .................. G06Q 20/40 |
| 2021/0383306 | A1* | 12/2021 | Somashekairah ........ G06N 7/01 |
| 2021/0401392 | A1 | 12/2021 | Bengtsson et al. |
| 2022/0044352 | A1 | 2/2022 | Liao et al. |
| 2022/0076385 | A1 | 3/2022 | K S et al. |
| 2022/0147816 | A1* | 5/2022 | Yanagisawa ............. G06N 3/04 |
| 2022/0182498 | A1 | 6/2022 | Singh et al. |
| 2022/0351004 | A1* | 11/2022 | Kanter ................ G06F 18/2113 |

OTHER PUBLICATIONS

"Prophet Forecasting at Scale", Facebook, Available online at: https://facebook.github.io/prophet/, 2018, 3 pages.

U.S. Appl. No. 16/868,942, "Corrected Notice of Allowability", dated Aug. 30, 2022, 9 pages.

U.S. Appl. No. 16/868,942, "Notice of Allowance", dated Jul. 5, 2022, 15 pages.

Bandara et al., "Forecasting Across Time Series Databases Using Recurrent Neural Networks on Groups of Similar Series: A Clustering Approach", Cornell University, Computer Science, Machine Learning, Available Online At: https://arxiv.org/abs/1710.03222, arXiv:1710.03222v2, Sep. 12, 2018, 33 pages.

Bandara et al., "Sales Demand Forecast in E-commerce Using a Long Short-term Memory Neural Network Methodology", Faculty of Information Technology, Monash University, Available Online At: https://arxiv.org/pdf/1901.04028.pdf, arXiv:1901.04028v2, Aug. 11, 2019, 16 pages.

Bass, "A New Product Growth for Model Consumer Durables", Management Science, vol. 15, No. 5, Jan. 1969, pp. 215-227.

Box et al., "Time Series Analysis: Forecasting and Control", Wiley Series in Probability and Statistics, 5th Edition, Jun. 2015, 42 pages.

Gantner et al., "Learning Attribute-to-Feature Mappings for Cold-Start Recommendations", Institute of Electrical and Electronics Engineers International Conference on Data Mining, Dec. 13-17, 2010, 10 pages.

Hu et al., "Forecasting Product Life Cycle Curves: Practical Approach and Empirical Analysis", Working paper, Collaboration and Professional Labor Productivity, Feb. 24, 2017, 3 pages.

Hyndman et al., "Forecasting with Exponential Smoothing: The State Space Approach", Springer Series in Statistics, 2008, 6 pages.

Laptev et al., "Time-Series Extreme Event Forecasting With Neural Networks at Uber", In International Conference on Machine Learning, vol. 34, 2017, 5 pages.

Pilaszy et al., "Recommending New Movies: Even a Few Ratings Are More Valuable Than Metadata", In Proceedings of the third ACM conference on Recommender systems, Oct. 23-25, 2009, pp. 93-100.

Taylor et al., "Forecasting at Scale", PeerJ Preprints, Open Access, Available Online At: https://doi.org/10.7287/peerj.preprints.3190v2, Sep. 27, 2017, 25 pages.

Xie et al., "A Unified Framework for Missing Data and Cold Start Prediction for Time Series Data", In Advances Neural Information Processing Systems Time Series Workshop, Oct. 2017, 12 pages.

Yan, "Toward Automatic Time-series Forecasting Using Neural Networks", Institute of Electrical and Electronics Engineers Transactions on Neural Networks and Learning Systems, vol. 23, No. 7, Jul. 2012, pp. 1028-1039.

Zhang et al., "Dynamic Key-Value Memory Networks for Knowledge Tracing", In Proceedings of the 26th International Conference on World Wide Web. International World Wide Web Conferences Steering Committee, Apr. 3-7, 2017, pp. 765-774.

Zimmermann et al., "Forecasting with Recurrent Neural Networks: 12 Tricks", In: Montavon G., Orr G.B., Müller KR. (eds) Neural Networks: Tricks of the TradeLecture, Lecture Notes in Computer Science, vol. 7700, 2012, 21 pages.

* cited by examiner

KEY-VALUE MEMORY NETWORK FOR PREDICTING TIME-SERIES METRICS OF TARGET ENTITIES

CROSS-REFERENCE TO RELATED APPLICATIONS

This application is a divisional application of U.S. patent application Ser. No. 16/868,942, filed on May 7, 2020, now allowed, the contents of all of which are incorporated herein by reference.

TECHNICAL FIELD

This disclosure generally relates to artificial intelligence. More specifically, but not by way of limitation, this disclosure relates to using or training key-value memory networks to predict time-series data that is usable for modifying interactive computing environments or other systems.

BACKGROUND

Automated modeling systems are used for analyzing or predicting interactions with, for example, online services that provide digital forums in which end users may interact with online content (e.g., by initiating processes involving items, interacting with items, commenting on items, etc.). Automated modeling systems use modeling algorithms that involve techniques such as logistic regression, neural networks, support vector machines, etc. These automated modeling algorithms are trained using training data, which can be generated by or otherwise indicate certain electronic interactions or circumstances. This training data is analyzed by one or more computing devices of an automated modeling system. The training data is grouped into predictor variables that are provided as inputs to the automated modeling system. The automated modeling system uses this analysis to make predictions using data describing similar circumstances. For example, an automated modeling system uses predictor variables to learn how to generate predicted time-series metrics with respect to an entity involving online processes (or other circumstances) that are similar to the predictor variables from the training data.

One example of such predicted time-series metrics is a prediction of interactions with a newly introduced item, function, or other feature accessible via an interactive computing environment. Existing automated modeling systems often employ recurrent neural networks ("RNN"), including long short-term memory ("LSTM") networks, to generate such predictions of time-series metrics. These conventional automated modeling systems are, for example, trained to predict a certain time-series metric using historical time-series data for that metric, where the historical time-series data covers a sufficiently large time period.

These existing automated modeling systems, however, present certain disadvantages. For example, as noted above, these conventional approaches use models that are trained for generating predicted time-series data for a target entity or item by learning from past time-series metrics of the same target entity or item. But the models used in these conventional approaches cannot be trained without historical time-series metrics of a sufficient quantity, and therefore could not be used to make an accurate prediction of a certain type of time-series metric for which no historical data is available. For these and other reasons, existing automated modeling techniques for predicting time-series metrics present disadvantages.

SUMMARY

Certain embodiments involve using key-value memory networks to predict time-series metrics data for an entity of interest, where the predicted time-series metrics data can be used for modifying interactive computing environments or other systems. For example, a computing system retrieves, for a target entity, target static feature data describing an attribute of the target entity having a value independent of time and target time-series feature data describing an input metric that is related to a target metric. The computing system also normalizes the target time-series feature data based on a normalization scale. The computing system also generates input data by concatenating the target static feature data, the normalized target time-series feature data, and time-specific feature data identifying a specific time or event with respect to a calendar. The computing system generates predicted time-series data for the target metric of the target entity by applying a key-value memory network to the input data. The key-value memory network can include a key matrix with key vectors that are learned from training static feature data and training time-series feature data and a value matrix with value vectors representing time-series trends.

In some embodiments, the computing system computes the normalization scale by, for example, selecting a set of comparative entities based on a comparison of the comparative entities' static feature data to the target entity's static feature data and determining the normalization scale from the selected comparative entities' time-series feature data.

In some embodiments, the key-value memory network includes a key-addressing layer, a value-reading layer, and an output layer. The key-addressing layer is used to generate a weight vector indicating similarities between key vectors of the key matrix and an input vector corresponding to the input data. The value-reading layer is used to generate a context vector from the weight vector and value vectors of the value matrix. The output layer includes a continuous activation function for computing predicted time-series data for the target metric from the context vector and the input vector.

In some embodiments, the predicted time-series data can be used for modifying one or more features of an interactive computing environment or other machine-implemented environment.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

Features, embodiments, and advantages of the present disclosure are better understood when the following Detailed Description is read with reference to the accompanying drawings.

DETAILED DESCRIPTION

The present disclosure involves using key-value memory networks to predict time-series metrics data, where the predicted time-series metrics data can be used for modifying interactive computing environments or other systems. As explained above, conventional solutions for predicting time-series metrics for target entities do not provide accurate predictions of time-series metrics for target entities for which automated modeling systems have insufficient historical time-series metrics. Certain embodiments described herein improve the performance of automated modeling systems by, for example, using a key-value memory network that is configured for generating predicted time-series metrics for a target entity. The key-value memory network is trained to operate on normalized input data time-series features along with static features and time-specific features. For use cases where insufficient historical data exists, normalization of time-series data can be performed using correlations between static features of an entity of interest and static features of other entities. The combination of this normalization process and the memory-based architecture of the key-value memory network allow for generating predicted time-series metrics that are more accurate than those provided by conventional solutions.

The following non-limiting example is provided to introduce certain embodiments. In this example, an automated modeling system applies a key-value memory network to input data associated with a target entity, such as static feature data of the target entity and time-series metrics of the target entity, along with other time-specific features. As a simplified example, a target entity could be a device or service that is accessible via an online environment. Examples of features described by static feature data of the target entity include physical features of the target entity, end-user functions provided by the target entity, etc. Examples of time-series metrics used as inputs include a series of views of a target entity via the online environment over a past time period, whereas a set of predicted time-series data outputted by the key-value memory network could be a series of uses of a target entity's feature over a future time period.

Continuing with this example, the automated modeling system normalizes the input time-series metrics of the target entity prior to applying the key-value memory network. To normalize the target entity's time-series data metrics, the automated modeling system identifies a set of comparative entities based on a comparison of the static feature data of the target entity to static feature data of the set of comparative entities. For instance, comparative entities could include devices or services with physical features, end-user functions, or other aspects that are similar to the target entity. The automated modeling system retrieves, from a database or other data structure, time-series metrics of these comparative entities (e.g., historical time-series data for the comparative entities). The automated modeling system computes a normalization scale from the time-series metrics of the comparative entities, and scales the target entity's time-series data metrics according to the computed normalization scale. This scaling operation generates a normalized set of the time-series data metrics for the target entity, which is concatenated with the target entity's static feature data and the time-specific features for input to the key-value memory network.

In this example, the automated modeling system applies the key-value memory network to an input vector with the pre-processed input data (i.e., the concatenated static feature data, time-specific features, and normalized time-series metrics) and thereby generates a set of predicted time-series data for the target entity. The key-value memory network includes a key matrix with key vectors that are learned from training static feature data and training time-series metrics, where a given key vector indicates a concept or representation of relationships between static features of an entity and associated time-series data. The key-value memory network also includes a value matrix with value vectors representing time-series trends. To compute the predicted time-series data, the key-value memory network generates a weight vector indicating similarities between the key vectors and the input vector. For instance, an element in the weight vector has a higher value if the input vector is more similar to a concept or representation encountered by the key-value memory network during training, and has a lower value if the input vector is less similar to the concept or representation. The key-value memory network also generates, for a given time step, a weighted combination of value vectors (e.g., vectors representing time trends) from the value matrix, where the weights are obtained from the weight vector. This weighted combination, also known as a context vector, is further processed by an output layer of the key-value memory network to generate a portion of the predicted time-series data. For example, the output layer could include a rectified linear unit ("ReLU") activation function that is suitable for generating continuous output data, i.e., a set of predicted time-series data for the target entity.

In some embodiments, a host computing system modifies features of an interactive computing environment based on the predicted time-series data for the target entity. In one example, a host computing system may provide access to an online tool, and the automated modeling system may be used to predict the usefulness or utilization of a new feature of that online tool. The automated modeling system can generate a set of predicted time-series data regarding the usefulness or utilization of a new feature. If the predicted time-series data indicates that the new feature would be used heavily, the host computing system could be modified accordingly (e.g., by devoting more computing resources to service the new feature, by presenting the new feature more prominently in menus or other interfaces, etc.).

As used herein, the term "time-series metric" describes a value of a feature or attribute of an entity that may change over time. Examples of a time-series metric include, but are not necessarily limited to, a number of instances in which a target entity or a feature of a target entity is used during a time period, accessed during a time period, provided during a time period, retrieved during a time period, etc.

As used herein, the term "predicted time-series data" describes a predicted time-series metric for a target entity that is generated with one or more automated modeling systems.

As used herein, the term "entity" describes a tangible or intangible item of interest having one or more attributes for which a time series of metrics can be generated. Examples of entities include, but are not limited to, online services for which usage metrics (e.g., tool accesses, serviced requests, logins, denials-of-service, etc.) can be observed or predicted, online content items for which interaction metrics can be observed or predicted (e.g., downloads, retrievals, clicks, completed transactions), and physical tools or machines for which performance metrics (e.g., breakdowns, component replacements, etc.) can be observed or predicted.

As used herein, the term "target entity" describes an entity for which an automated modeling system generates a set of predicted time-series data.

As used herein, the term "time-specific feature" is used to refer to input data representing relative points in time. For instance, time-specific feature data could identify a specific time or event with respect to a calendar (e.g. day of the week, day of the month, day of the year, hour of the day, an amount of time to or from an event such as a holiday, etc.). In an example, time-specific features are categorical features comprising binary encoded representations of these relative points in time.

As used herein, the term "static feature" includes a feature of an entity that is not expected to vary with time. For example, examples of a static feature include a name, a weight, a physical dimension, a description of an entity, a location, a color, or other static feature.

Certain embodiments provide improvements to computing systems used for predicting metrics regarding the performance or usage of target entities in online or other machine-implemented environment. These improvements can be effected by automatically applying various rules of a particular type. For instance, existing machine-learning techniques, such as long short-term memory ("LSTM") networks, fail to accurately predict certain metrics in the absence of historical data regarding related metrics. These problems can be addressed by features described herein. For instance, the particular featurization techniques and key-value memory network used herein can accurately predict performance metrics without requiring such historical data. Thus, embodiments described herein utilize machine-learning techniques to improve computer-implemented processes for simulating the performance of certain target entities. In some embodiments, these improvements can facilitate improvements to machine-implemented environments (e.g., online services, electronic content services, automation systems etc.) by effectively simulating metrics that predict performance issues, which may be proactively addressed.

Figure 1:
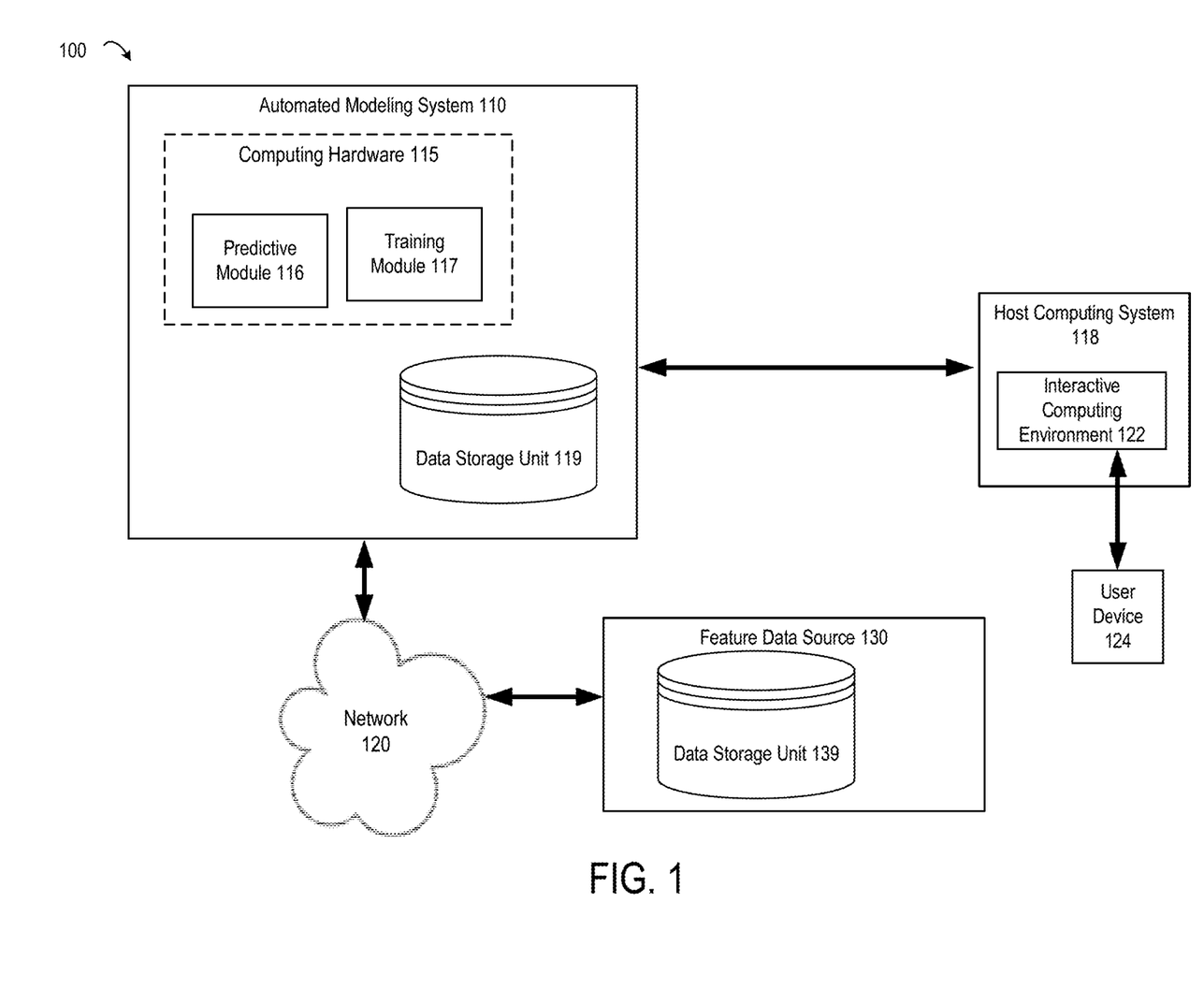
FIG. 1 depicts an example of a computing environment for using key-value memory networks to make predictions of time-series metrics, according to certain embodiments of the present disclosure.

Example of an Operating Environment for Using Key-Value Memory Networks to Predict Time-Series Data Referring now to the drawings, FIG. 1 depicts an example of a computing environment 100 in which key-value memory networks are used to make predictions of time-series metrics, according to certain embodiments of the present disclosure. In some embodiments, the computing environment 100 includes an automated modeling system 110, which is implemented with computing hardware 115, and one or more feature data sources 130. One or more of the automated modeling system 110, the computing hardware 115 and the feature data source 130 could include a device having a communication module capable of transmitting and receiving data over the network 120. For instance, one or more of the automated modeling system 110, the computing hardware 115, and the feature data source 130 could include a server, a desktop computer, a laptop computer, a tablet computer, a television with one or more processors embedded therein and/or coupled thereto, a smart phone, a handheld computer, or any other wired or wireless, processor-driven device. In some embodiments, the computing hardware 115 of an automated modeling system 110 communicates, via the network 120, with one or more computing devices, external to and independent of the automated modeling system 110, that provide access to the feature data source 130. In additional or alternative embodiments, the computing hardware 115 of an automated modeling system 110 communicates, via the network 120, with one or more computing devices that are part of the automated modeling system 110 provide access to the feature data source 130.

In the example depicted in FIG. 1, the automated modeling system 110 includes a computing hardware 115 that can execute program code, such as a predictive module 116 and a training module 117. The automated modeling system 110 also includes a data storage unit 119. In certain examples, the computing hardware 115 includes the feature data source 130 or is otherwise communicatively coupled to the feature data source 130.

In some embodiments, the predictive module 116 is executed by processing hardware and thereby perform operations for predicting time-series metrics for a target entity using a key-value memory network. For instance, the automated modeling system 110 receives a request that includes a selection of one or more target entities and one or more target metrics to be predicted. The automated modeling system 110 services the request using the predictive module 116. The predictive modules 116 accesses a key value memory network and generates a set of predicted time-series data for a target entity using the key value memory network. The automated modeling system 110 outputs the predicted time-series data in response to the request. Examples of using a key-value network to generate such time-series predictions are described herein with respect to FIGS. 2 and 3.

The computing hardware 115 also executes a training module 117 for performing one or more functions used in training, using training data, a key value memory network to predict time-series metrics for target entities. Examples of training data includes time-series metrics, static feature data, and time-specific features for a set of entities. The computing hardware 115 trains, using training data, the key value memory network to generate predicted time-series data for one or more target metrics. For instance, the training module 117 updates one or more parameters of the key value memory network based on a comparison of predicted time-series metrics to corresponding ground truth time-series metrics. An example of a training process performed by the training module 117 is described herein with respect to FIG. 4.

In some embodiments, a host computing system 118 uses the predicted time-series data generated by the automated modeling system 110 to modify one or more operations of an interactive computing environment or other machine-implemented environment. For example, the automated modeling system 110 provides predicted time-series metrics to the host computing system 118 In some embodiments, doing so causes the host computing system 118 to modify an interactive user experience of the interactive computing environment 122 based on the set of predicted time-series data. In one example, a development platform could rearrange the layout of an interface so that features or content associated with predicted time-series data indicating greater utility or value are presented more prominently, features or content associated with predicted time-series data indicating greater utility or value, or some combination thereof. In various embodiments, the development platform performs these modifications automatically based on an analysis of the set of predicted time-series data, manually based on user inputs that occur subsequent to presenting the set of predicted time-series data, or some combination thereof.

In some embodiments, modifying one or more interface elements is performed in real time, i.e., during a session between the interactive computing environment 122 and a user device 124. Examples of an interface element may include, but are not limited to, visual content (e.g., colors and layout, display of certain items, displays of certain items from certain perspectives, display of certain item information, available actions in certain states, etc.) and design features (e.g., menus, search functions, and other elements). As one example, an interactive computing environment 122 may include different modes, in which a first type of interactive user experience (e.g., placement of menu functions, hiding or displaying certain content associated with an item, etc.) is presented to a first type of user group and a second type of interactive user experience is presented to a second type of user group. If, during a session, a set of predicted time-series data for a target metric is computed that indicates that operating in the first mode for a particular user will cause an undesirable experience, the interactive computing environment 122 could switch to the second mode in an effort to improve the user experience. As another example, an interactive computing environment 122 may be used to provide user devices 124 with access to different interactive content items (e.g., web pages, elements within web pages or mobile applications, etc.). A set of predicted time-series data for a target entity could be, for instance, a set of predicted interactions (e.g., downloads, completed transactions, etc.) involving different types of content items. If a set of predicted time-series data indicates that certain interactive content items are more likely to be used, the interactive computing environment 122 could be modified to change the prominence of or accessibility to these content items.

An example of a data storage unit 119 or a data storage unit 139 includes a local or remote data storage structure accessible to the computing hardware 115 suitable for storing information. A data storage unit can store relevant data as one or more databases, one or more matrices, etc. For instance, the data storage unit 119 could store training data used in a training phase, whereas the data storage unit 139 could store data using in a forecasting phase.

Examples of the data network 120 include, but are not limited to, internet, local area network ("LAN"), wireless area network, wired area network, wide area network, and the like. For example, the data network 120 includes a wired or wireless telecommunication means by which network systems can communicate and exchange data. For example, each network 120 can be implemented as, or may be a part of, a storage area network ("SAN"), a personal area network ("PAN"), a metropolitan area network ("MAN"), a LAN, a wide area network ("WAN"), a wireless LAN ("WLAN"), a virtual private network ("VPN"), an intranet, an Internet, a mobile telephone network, a card network, a Bluetooth network, a near field communication ("NFC") network, any form of standardized radio frequency, or any combination thereof, or any other appropriate architecture or system that facilitates communication of signals, data, and/or messages (generally referred to as data). It should be understood that the terms "data" and "information" are used interchangeably herein to refer to text, images, audio, video, or any other form of information that can exist in a computer-based environment.

In some embodiments, the automated modeling system 110 includes or is implemented with a cloud-based online service. For instance, a service provider computing system could host the automated modeling system 110. Remote computing devices could access the automated modeling system 110 and identify data for training a key-value memory network, input data used by the trained key-value network in a forecasting phase, or both. For instance, the feature data source 130 could be hosted by a client computing system or customer computing system of the service provider computing system, hosted by a third-party system identified by a client computing system or customer computing system of the service provider computing system, or some combination thereof.

Figure 2:
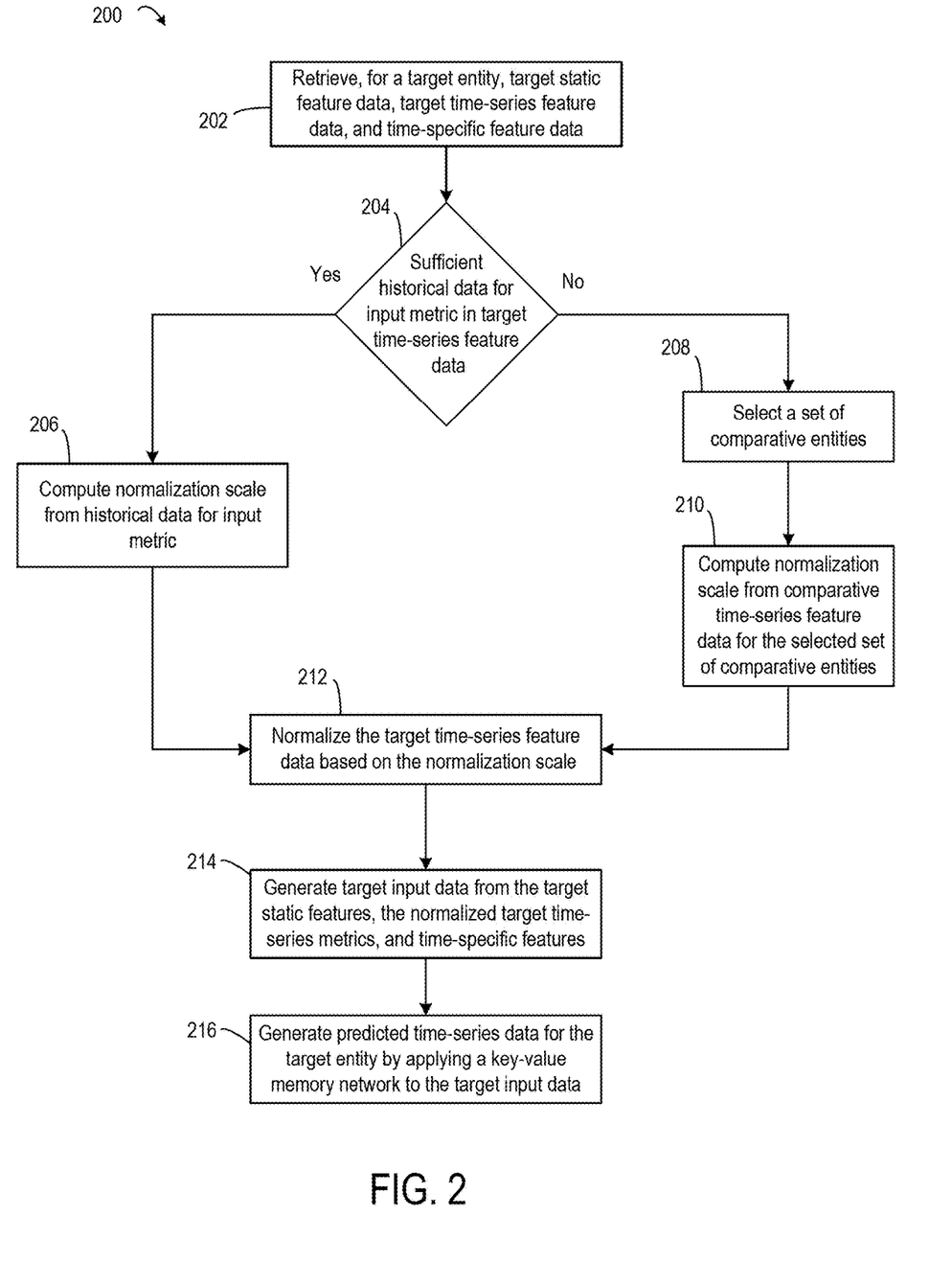
FIG. 2 depicts an example of a method for generating predictions of time-series metrics using a key-value memory network, according to certain embodiments of the present disclosure.

Examples of Operations for Using a Key-Value Network Used to Predict Time-Series Metrics FIG. 2 depicts an example of a method 200 for generating predictions of time-series metrics by applying a key-value memory network, according to certain embodiments. For illustrative purposes, the method 200 is described with reference to the components illustrated in FIG. 1, though other implementations are possible. The computing hardware 115 executes one or more predictive modules 116 (or suitable other program code) to implement method 200. For example, the program code for the predictive module 116, which is stored in a non-transitory computer-readable medium, is executed by one or more processing devices. Executing the predictive module 116 causes the processing device to access the feature data from a non-transitory computer-readable medium of the computing hardware 115 or a different non-transitory computer-readable medium, such as the feature data source 130.

Blocks 202-214 of the method 200 involve a featurization stage for processing input prior to a forecasting stage, which involves the application of a key-value memory network at block 216. At block 202, the method 200 involves retrieving, for a target entity, target static feature data, target time-series feature data, and time-specific feature data. For example, the predictive module 116 could be executed by the computing hardware 115 to implement block 202. The predictive module 116 could retrieve static feature data $X_i$, which describes one or more attributes of the target entity having a value independent of time, from the data storage unit 119, the data storage unit 139, or some combination thereof. For instance, the static feature data $X_i$ could be a vector representation of one or more features that do not change over time (e.g., appearance, components, origin, functionality, etc.). The predictive module 116 could also retrieve target time-series feature data from the data storage unit 119, the data storage unit 139, or some combination thereof. The target time-series feature data could include one or more time series (denoted $z_i,t$ herein) that describe one or more input metrics related to a target metric (i.e., a metric of interest whose values are being predicted with the automated modeling system 110). The predictive module 116 could also retrieve time-specific feature data $\eta_t$ from the data storage unit 119, the data storage unit 139, or some combination thereof.

The target time-series feature data $z_{i,t}$ includes time series for one or more input metrics that are related to or otherwise associated with the target metric for the target entity i. As discussed below with respect to blocks 204-208, the predictive module 116 normalizes input target time-series feature data $z_{i,t}$ and thereby generates normalized target time-series feature data that are included in a vector $\tau_{i,t}$. In some embodiments, the vector $\tau_{i,t}$ also includes an age of the target entity, which is a normalized period of interest. In a simplified example, if the target entity is a product, the period of interest could be an amount of time since launch of that product.

The time-specific feature data $\eta_t$ can be a vector representation of time-specific features. The time-specific feature data $\eta_t$ is used to account for variations caused by the timing at which values of a target metric are predicted. For instance, the time-specific feature data $\eta_t$ could represent one or more of a day of the week, a day of the month, a month of the year, a week of the year, and a week of the month. The automated modeling system 110 can be configured to retrieve the relevant values (e.g., day of the week, day of the month, etc.) and convert these values to categorical features via binary encoding and form $\eta_t$. Additionally or alternatively, the time-specific feature data $\eta_t$ could represent one or more event-related features, such as indicators of holidays and festivals and proximity to these events. In some embodiments, a Boolean vector could be used as an input feature that represents whether a given day is a holiday or festival, and value of a triangular membership function $$\left(e.g., \max\left(1 - \frac{|day_{index} - holiday_{index}|}{7}, 0\right) = value\right)$$

could be used to include the proximity of the day to an event (e.g., a membership function over a 14-day window peaking on the day of the event).

At block 204, the method 200 involves determining if sufficient historical data for an input metric described by the target time-series feature data is available. For example, the predictive module 116 could be executed by the computing hardware 115 to implement block 204. In some embodiments, the predictive module 116 performs the determination at block 204 by comparing the historical data for the input metric to a threshold. For instance, the threshold could be an amount of historical data covering a time period that is at least equal to a training time period used for training the key-value memory network. If an amount of historical data for the input metric covers a time period that is shorter than the training time period, then the amount of historical data is insufficient. In additional or alternative embodiments, the predictive module 116 performs the determination at block 204 by referring to a configuration setting that is modifiable via user input received by the automated modeling system 110. For instance, an operator of the automated modeling system 110 could provide an input specifying that time-series data for an input metric related to the target metric was not used to train the key-value memory network. The predictive module could determine, based on the input, that the amount of historical data for the input metric is insufficient.

If sufficient historical data for the input metric is available, the method 200 involves computing a normalization scale from historical data for the input metric, as depicted at block 206. For example, the predictive module 116 could be executed by the computing hardware 115 to implement block 206. The predictive module 116 computes a normalization scale $v_i$, which is a constant that is specific to the target entity i. In one example, the predictive module 116 computes the normalization scale $v_i$ for the target entity i as follows:

$$v_i = 1 + \frac{1}{T}\sum_{t=1}^{T} z_{i,t}. \tag{1}$$

In Equation (1), T is the time period used during a training process for the key-value memory network and $z_{i,t}$ is the time series of the for the input metric of the target entity at time t. (An example of this training process is described herein with respect to FIG. 4.)

The normalization scale $v_i$ for the target entity i computed in Equation (1) using values of the input metric over a training time period T. But historical data for the input metric may be unavailable because the target entity was not accessible during a training period (e.g., an item was not accessible via an interactive computing environment) and only became available during a forecasting period after the completion of the training process. For such an item, Equation (1) yields a value of 1 for the scale, such that a "normalized" time series would be equal to the time series without normalization.

If sufficient historical data for the input metric is not available, the method 200 involves selecting a set of comparative entities, as depicted at block 208. The predictive module 116 could be executed by the computing hardware 115 to implement block 208.

In block 208, the predictive module 116 calculates a set of correlation weights for other entities. Each correlation weight μ indicates a correlation between target static feature data for the target entity and static feature data from other entities. For example, a higher correlation weight could indicate a higher degree of similarity between static feature data of the comparative entity and static feature data of the target entity, and a lower correlation weight could indicate a lower degree of similarity between static feature data of the comparative entity and static feature data of the target entity. In some embodiments, a correlation weight is computed by calculating a dot product of a vector of static feature data of the target entity and a vector of comparative static feature data of a comparative entity. The correlation weight can be the calculated dot product or can be a separate value derived from the calculated dot product.

The predictive module 116 selects the set of comparative entities that have sufficiently high correlation weights. In some embodiments, the predictive module 116 selects a number of k comparative entities having correlation weights indicating the k largest correlations. For instance, the predictive module 116 could select five comparative entities having the five greatest correlation weights. In additional or alternative embodiments, a comparative entity has a sufficiently high correlation weight if the correlation weight μ for the target entity and the comparative entity exceeds a threshold correlation weight, such as a threshold correlation weight specified by one or more user inputs to the automated modeling system 110. In such embodiments, the predictive module 116 selects the comparative entities having correlation weights that exceed the threshold correlation weight.

As an illustrative example, the target entity could be an electronic tool or other item accessible via an interactive computing environment. Various static features (e.g., the tool's appearance, components, brand, or other attributes that do not change over time) can be represented in the static feature data as one or more feature vectors, which are stored in the data storage unit 139 of the feature data source 130. In addition, various static features (e.g., appearance, components, brand, or other attributes that do not change over time) of other electronic tools or other item accessible via an interactive computing environment can also be represented using feature vectors stored in the data storage unit 139 of the feature data source 130. At block 208, the predictive module 116 retrieves these various feature vectors and computes correlations between the target entity (e.g., a tool or item of interest) and other entities (e.g., other tools or items for which historical time series data is available).

At block 210, the method 200 involves computing a normalization scale from comparative time-series features for the selected set of comparative entities. For example, the predictive module 116 could be executed by the computing hardware 115 to implement block 210. The predictive module 116 accesses a vector $\mu_i$ whose elements are correlation weights computed from the static feature data of the comparative entities for the target entity i and computes a normalization scale $v_i$ from the correlation weights $\mu_i$. As one example, the predictive module 116 computes the normalization scale as follows:

$$v_i = \frac{(<\mu_i, V_i>)}{\|\mu_i\|_1}. \quad (2)$$

In Equation (2), $V_i$ is a vector whose elements are component normalization scales $v_c$ computed for time series $z_c$ of the comparative entities c, $(<\mu_i,V_i>)$ is an inner dot product of vectors $\mu_i$ and $V_i$ and $\|\mu_i\|$ is an L1 norm of $\mu_i$. As one example, the predictive module 116 computes a component normalization scale $v_{c,k}$ for the $k^{th}$ comparative entity's time-series $z_c$ as follows:

$$v_{c,k} = 1 + \frac{1}{T}\sum_{t=1}^{T} z_{c,t}. \quad (3)$$

In Equation (3), as in Equation (1), T is the time period used during a training process for the key-value memory network. The term $z_{c,t}$ is the time series of the comparative entity (i.e., a time-series feature of the comparative entity) at time t.

At block 212, the method 200 involves normalizing the target time-series feature data based on the normalization scale. For instance, the predictive module 116 could be executed by the computing hardware 115 to implement block 212. The predictive module 116 normalizes target time-series feature data with respect to the normalization scale $v_i$ as computed at block 206 or block 210. In one example, the predictive module 116 normalizes a target time-series metric $z_1$ as follows:

$$z'_{i,t} = \frac{z_{i,t}}{v_i}. \quad (4)$$

In Equation (4), $z'_{i,t}$ is the normalized time-series metric for a target entity i, $z_{i,t}$ is the time series at time t for the comparative entity i. The predictive module 116 includes the normalized time series metrics in a vector $\tau_{i,t}$. In some embodiments, the predictive module 116 also computes a normalized period of interest (e.g., an age of an item for which metrics are to be predicted) and includes this value in vector $\tau_{i,t}$.

At block 214, the method 200 involves generating target input data from the target static feature data, the normalized target time-series feature data, and time-specific features. For instance, the predictive module 116 could be executed by the computing hardware 115 to implement block 214. In this example, the predictive module 116 generates an input vector by concatenating the target static feature data $X_i$, normalized target time-series feature data $\tau_{i,t}$, and target time-specific feature data $\eta_t$.

In some embodiments, using the concatenated target static feature data $X_i$, normalized target time-series feature data $\tau_{i,t}$, and target time-specific feature data $\eta_t$ as an input to a key-value memory network can improve the accuracy of a predicted time series for a metric of interest. As one example, using separate vectors $\tau_{i,t}$ and $X_i$ to represent time-series features and static features, respectively, captures the similarity in time series between items that changes with time (e.g., via the normalized target time-series feature data $\tau_{i,t}$) apart from the similarity in their static features (e.g., via the target static feature data $X_i$). As another example, the incorporation of time-specific features $\eta_t$, both during training and when applying the trained key-value memory network, accounts for spikes in metric values that may occur due to certain events (e.g., holidays, festivals, etc.).

At block 216, the method 200 involves generating predicted time-series data for the target entity by applying a key-value memory network to the target input data. For example, the predictive module 116 could be executed by the computing hardware 115 to implement block 216. In this example, the predictive module 116 accesses a key-value memory network from a suitable non-transitory computer-readable medium, such as the data storage unit 119. The key-value memory network includes a key matrix and a value matrix. Applying the key-value memory network involves performing a key-addressing operation, in which weights are computed from the key matrix and the input data. Applying the key-value memory network also involves performing a memory-reading operation, in which the value matrix and the weights computed from the key matrix are used to compute a predicted value of a metric of interest at a given time step.

Figure 3:
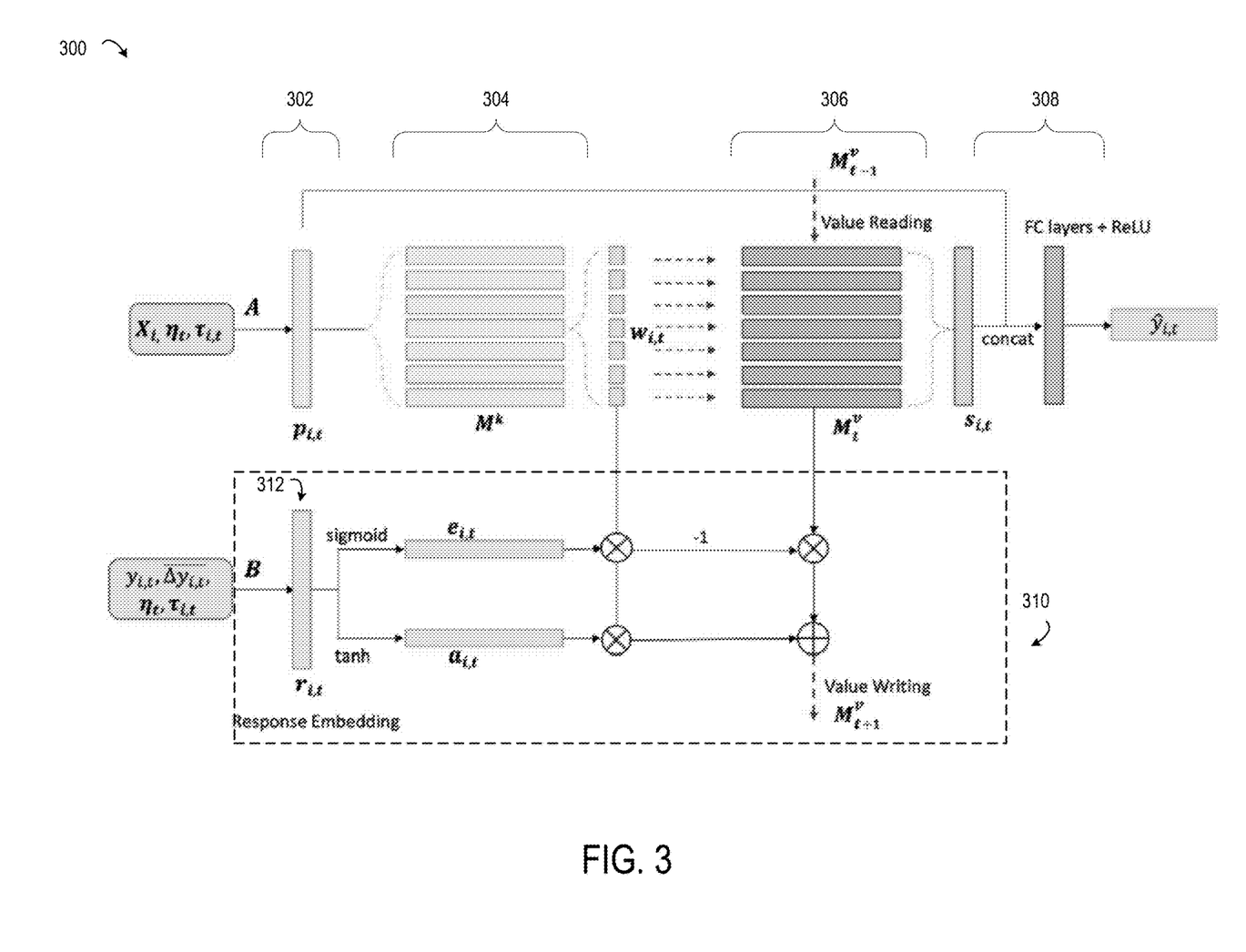
FIG. 3 depicts an example of a dynamic key-value memory network that could be used in the method of FIG. 2, according to certain embodiments of the present disclosure.

For instance, FIG. 3 depicts an example of a key-value memory network 300 that implements block 216 of FIG. 2. In this example, the key-value memory network 300 is a dynamic key-value memory network that includes an entity embedding layer 302, a key-addressing layer 304 in which a key matrix $M^k$ outputs a weight vector $\omega_{i,t}$, a value-reading layer 306 in which a matrix $M^v$ outputs a context vector $s_{i,t}$, an output section 308 with a set of fully connected layers and an output layer, and a value-writing section 310.

In the key-addressing layer 304, the key matrix $M^k$ includes a set of key vectors. A key vector $M^k(j)$ is a row of the key matrix, and there are n number of these rows. The number n can be specified via one or more inputs to the automated modeling system 110. Each key vector is learned, during a training process, from a set of training static feature data and training time-series features. For instance, these key vectors can represent different concepts that are learned by the key-value memory network during a training process. In the training process, the training module 117 iteratively updates the key matrix such that the key-value memory network learns representations that capture the similarities (or lack thereof) between different entities and account for time-dependent variations in these similarities.

In the value-reading layer 306, the value matrix $M^v$ includes value vectors representing time-series trends, such as trends in time-series of various entities. Each value $M^v(j)$ is a row of the value matrix, and there are n number of these rows. The number n can be specified via one or more inputs to the automated modeling system 110. In a training process, the training module 117 performs an initialization of the value matrix $M^v$. In this initialization, a set of initial value vectors representing time-series trends is learned. This initial set of value vectors can be modified through a value-writing operation, discussed below.

In this example, the predictive module 116 provides the target input data to an input layer of the key-value memory network (not depicted) that precedes the entity embedding layer 302. The entity embedding layer 302 generates a reduced-dimension input vector from the input data received via the input layer. For instance, the entity embedding layer 302 could include a linear layer that reduces an input vector $[X_i, \tau_{i,t}, \eta_t]$ to a smaller dimension $d_p$. In an example, the predictive module 116 performs this embedding as follows:

$$p_{i,t} = A[X_i, \tau_{i,t}, \eta_t] \qquad (5).$$

In Equation (5), the term $p_{i,t}$ is the embedding for the target entity and the term A is the conversion matrix.

In this example, the key-addressing layer 304 performs a key-addressing operation (e.g., a query) using the key matrix. The key-addressing operations generate a set of weights indicating respective similarities between the key vectors and the input vector. For instance, for a given query, the predictive module 116 calculates the weight of each key in the following manner:

$$\omega_{i,t}(j) = \sigma(p_{i,t}^T \cdot M^k(j)) \qquad (6).$$

In Equation (6), the term $\sigma(\ )$ is a softmax function, and the term $\omega_{i,t}(j)$ is the weight for the $j^{th}$ key vector $M^k(j)$ for a given embedding $p_{i,t}$ of a target entity i at time t. The key-addressing layer outputs a weight vector with these weights.

In some embodiments, the weight vector allows for interpretability of the key-value memory network. For instance, a weight vector indicates, for any given entity, entities that are similar. This is useful in deriving insights about the data and the model behavior. As an illustrative example, a target metric may be transfers of a target entity such as a certain item or product. Since the weight vectors generated using a key matrix represent the key-value memory network's perception of a given item or product, studying these weight vectors for each item or product as a function of time is helpful in identifying which items products are highly correlated with respect to transfers of the item or product for a specific period of time. For instance, if the key-value memory network predicts the sales of a newly launched item or product to be low for the next week, and the weight vectors of the newly launched item or product are maximally correlated to some older products having a similar characteristics (e.g., brand, origin, etc.) during that time, it can be determined that the key-value memory network predicts the low sales because the network expects the sales of the newer product to behave similarly to those other products. Therefore, the key-value memory network is interpretable in the sense that it can be used to identify the reasoning for some of the expected or unexpected predictions.

The value-reading layer 306 uses the value matrix to compute one or more context vectors. Each context vector is generated by weighting a memory vector with the weight vector. For instance, the predictive module 116 calculates a context vector $s_{i,t}$ in the following manner:

$$s_{i,t} = \sum_{j=0}^{n} M_t^v(j) * \omega_{i,t}(j). \qquad (7)$$

The predictive module 116 concatenates the embedding $p_{i,t}$ of a target entity i at time t with the context vector computed at time step t via Equation (7).

To generate the predicted time-series data in this example, the predictive module 116 accesses an output section 308 of the key-value memory network. The output section computes a set of predicted time-series data (e.g., an output value for the target metric at time t) by applying a continuous activation function to the context vector and the input vector. For instance, in FIG. 3, the predictive module 116 provides the concatenated entity embedding and context vector to an output section 308. The output section 308 includes a series of fully connected layers followed by an output layer, where the output layer includes a ReLU. The ReLU outputs $\hat{y}_{i,t}$.

In some embodiments, the predictive module 116 denormalizes the predicted metric value $\hat{y}_{i,t}$ outputted by the key-value network. For instance, the predictive module 116 could denormalize the predicted metric value $\hat{y}_{i,t}$ via the equation $Y_{i,t} = \hat{y}_{i,t} * v_i$.

The value-writing section 310 of the key-value memory network 300 is used to update the value matrix. Updating the value matrix involves determining how much of the value matrix at time step t should be retained at time step t+1 and what information should be added to the value matrix after time step t for use at time step t+1. The value-writing section 310 includes a response embedding layer 312 that generates a response embedding vector $r_{i,t}$. The response embedding vector $r_{i,t}$ represents a combination of a predicted value of a metric at time t, a ground truth value (e.g., an observed value) of that metric at time t, and the time-specific features and time-series features used to generate the predicted value of the metric. For instance, the predictive module 116 could concatenate the observed output $y_{i,t}$, a difference $\overline{\Delta y_{i,t}}$ that is the quantized and encoded percentage difference between the observed output $y_{i,t}$ and the predicted output $\hat{y}_{i,t}$, the normalized target time-series feature data $\tau_{i,t}$ used to generate the predicted output $\hat{y}_{i,t}$, and time-specific feature data $\eta_t$ used to generate the predicted output $\hat{y}_{i,t}$. The quantized percentage difference is determined based on a percentage difference between the network response and its actual value. For example, the quantized percentage difference include "1" for a percentage difference in a range between 0-14.99%, "2" for a percentage difference in a range between 15-29.99%, and "3" for a percentage difference in a range between 30-44.99%. These ranges and resulting quantized values may be preconfigured by an operator of the automated modeling system 110.

The response embedding layer 312 reduces this concatenated data to a smaller dimension $d_r$. For example, the predictive module 116 computes the response embedding vector as follows:

$$r_{i,t} = B[y_{i,t}, \overline{\Delta y_{i,t}}, \eta_t, \tau_{i,t}] \qquad (8).$$

In Equation (8), the term B represents a conversion matrix.

In the value-writing section 310, an erase signal $e_{i,t}$ indicates how much of the value matrix should be retained (i.e., what data should be removed from the value matrix). For instance, the predictive module 116 could compute an erase signal $e_{i,t}$ in the following manner:

$$e_{i,t} = \text{sigmoid}(E^T r_{i,t} + b_e) \qquad (9).$$

In Equation (9), the term $E^T$ represents a weight matrix and the term $b_e$ represents a bias parameter. Furthermore, an addition signal $a_{i,t}$ indicates what data should be added to the value matrix. For instance, the predictive module 116 could compute an addition signal a in the following manner:

$$a_{i,t} = \tan h(D^T r_{i,t} + b_a) \qquad (10).$$

In Equation (10), the term $D^T$ represents a weight matrix and the term $b_a$ represents a bias parameter. In the example depicted in FIG. 3, the predictive module 116 updates the value matrix in the following manner:

$$M_t^v(j) = M_{t-1}^v(j) \odot [1 - \omega_{i,t}(j) e_{i,t}] + \omega_{i,t}(j) a_{i,t} \qquad (11).$$

The predictive module 116 uses the updated value matrix to predict a value of the metric of interest at time t+1. Thus, even though various parameters of the key-value memory network 300 are not updated through backpropagation, the value matrix is still updated through the response embeddings at each time step (e.g., each day).

In some embodiments, the method 200 can be used for modifying features of an interactive computing environment based on the predicted time-series data for the target entity. In an example, the computing device modifies the interactive computing environment in response to the predicted time-series data exceeding a predefined threshold or in response to not meeting a predefined limit. Modifying an interactive computing environment can include editing a webpage associated with the target entity, limiting or prohibiting access to a web page or computing resource, activating or deactivating computing devices that are connected to the online environment and associated with the target entity, or otherwise modifying an interactive computing environment.

For example, the target entity includes an online product listing and the computing hardware 115 determines that sales next week will exceed a 10,000 unit threshold. In this example, in response to the time-series prediction exceeding the predefined threshold amount, the computing hardware 115 modifies an interactive computing environment by changing a position of a display of the online product listing on a webpage to emphasize the online product listing. Modifying an electronic environment could include modifying an electronic display, initiating a supply order, initiating one or more transactions, canceling one or more transactions, taking a website offline, blocking a user from accessing online services, transmitting an alert, message, or other communication to a system computing device, or otherwise modifying the electronic environment.

In one example, the automated modeling system 110 may provide access to an online tool, and the computing hardware 115 be used to predict the usefulness or utilization of a new feature of that online tool. In an example, the target entity could be a new traffic signal at a new intersection for which the computing hardware 115 predicts a time-series metric including a traffic volume passing through the traffic signal at one or times over a time window. In this example, the traffic signal is connected to the interactive computing environment and is configurable by the computing hardware 115. In this example, in response to determining that a predicted traffic volume will exceed a threshold of 400 cars per minute at 3:00-5:00 p.m. each of the next five days, the computing hardware 115 schedules the traffic signal to enable a left turn arrow feature from 2:30 p.m.-5:30 p.m. to be able to handle the increased traffic flow at the intersection during the predicted hours.

In yet another example, the target entity includes the interactive computing environment and the predicted time-series data includes a processing load at one or times over a time window. In this example, the interactive computing environment is configurable by the computing hardware 115. In this example, in response to determining that the processing load will exceed a threshold in two hours, the computing hardware 115 modifies the interactive computing environment by requesting the interactive computing environment to increase processing capacity by adding additional hardware to the interactive computing environment.

Figure 4:
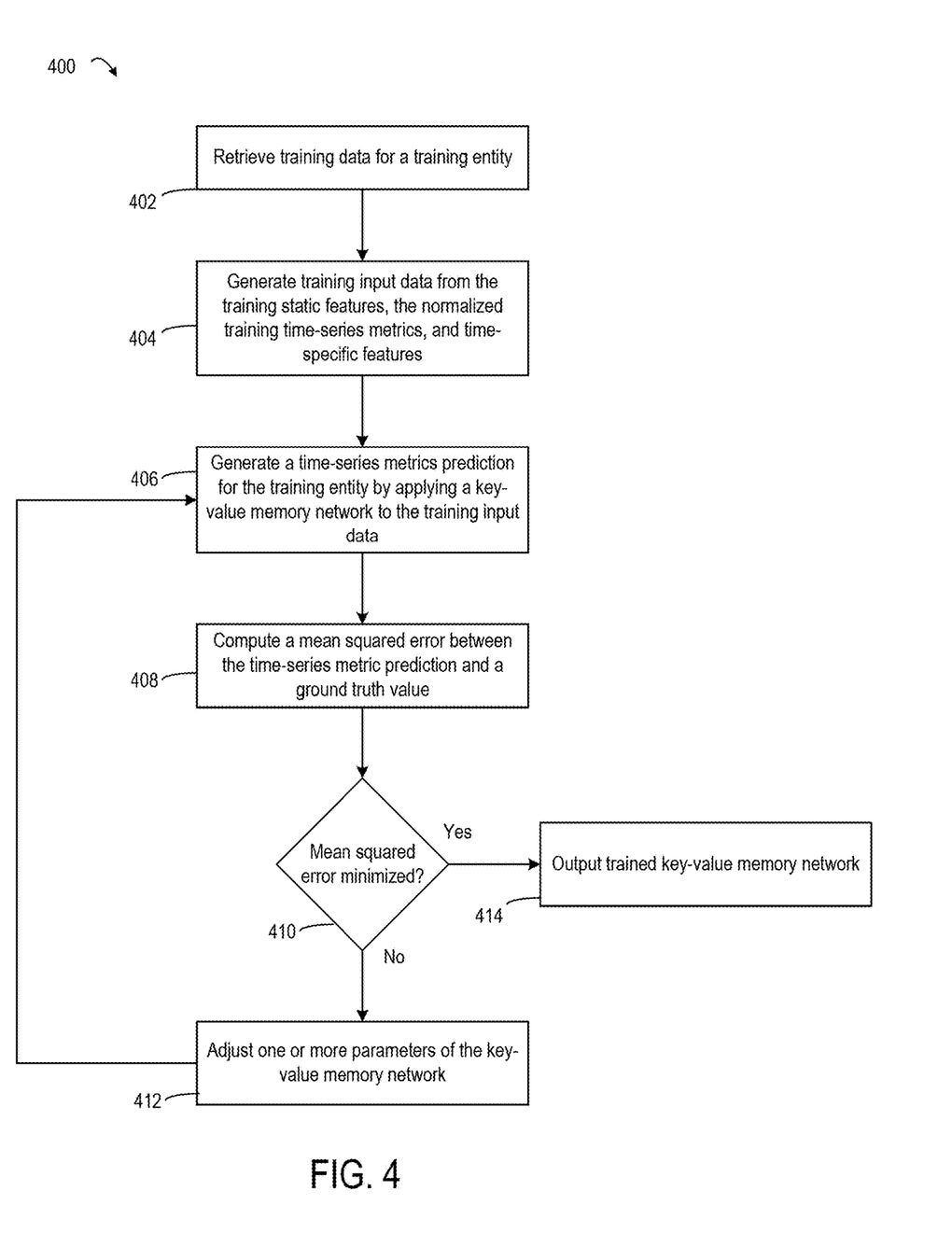
FIG. 4 depicts an example of a method for training a key-value memory network to make predictions of time-series metrics, according to certain embodiments of the present disclosure.

Example of a Training Process for a Key-Value Network Used for Predicting Time-Series Metrics FIG. 4 depicts an example of a method 400 for training a key value memory network to generate predicted time-series data for one or more target metrics, according to certain embodiments. The method 400 is described with reference to the components illustrated in FIG. 1. The computing hardware 115 executes one or more training modules 117 (or suitable other program code) to implement method 400.

The method 400 involves retrieving training data for a training entity, as depicted at block 402. For example, the training module 117 implements block 402 by performing operations similar to those described above with respect to one or more of blocks 202-212 of the method 200. At different iterations, the training module 117 can retrieve different sets of training time-series feature data. In an example involving predictions of a particular target metric of interest (e.g., views for an entity such as a website displaying a certain item), the training module 117 can perform one or more iterations in which an insufficient amount historical data for a input metric is available (e.g., a cold start in which no values of the input metric have been observed) and one or more iterations in which a sufficient amount historical data for a input metric is available. Thus, block 402 can involve retrieving, generating, or otherwise obtaining training static feature data, normalized training time-series metrics, and training time-specific feature.

The method 400 also involves generating training input data from the training data (e.g., the training static feature data, the normalized training time-series metrics, and the training time-specific features), as depicted at block 404. For example, the training module 117 implements block 404 by performing operations similar to those described above with respect to block 214 of the method 200.

The method 400 also involves generating a set of predicted time-series data for the training entity by applying a key-value memory network to the training input data, as depicted at block 406. For example, the training module 117 implements block 406 by performing one or more operations similar to those described above with respect to block 216 of the method 200, with respect to the example of a key-value matrix depicted at FIG. 3, or both. This training set of predicted time-series data can include predicted values of a particular metric during a particular time period (e.g., the training time period T).

A loss function is used to guide the training of the key-value memory network. For instance, the method 400 also involves computing a mean squared error ("MSE") between the time-series metric prediction and a ground truth value, as depicted at block 408. For instance, the training module 117 implements block 408 by retrieving a ground-truth set of time-series data comprising observed values of the particular metric during a particular time period (e.g., the training time period T). The training module 117 retrieves a ground truth value of y for a set of training input data η, τ, and X. In one example, a ground truth time-series metric includes a known time-series metric that can be compared with a predicted time-series metric to evaluate a performance of the predictive accuracy of the key-value memory network. The training module 117 computes the MSE between the time-series metric prediction computed at block 406 and the retrieved ground truth value. The training module 117 stores the MSE for the iteration, along with configuration data identifying values of the parameters of the key-value network for that iteration (i.e., the network configuration that resulted in the time-series metric prediction).

The method 400 also involves determining if the MSE has been minimized, as depicted at block 410. For example, the training module 117 implements block 410 by comparing MSE values for different iterations of the method 400, respectively. The training module 117 identifies the iteration having the lowest MSE. The training module 117 also identifies the configuration of the key-value memory network at the iteration having the lowest MSE.

If the MSE has not been minimized, the method 400 also involves adjusting one or more parameters of the key-value memory network, as depicted at block 412. For example, the training module 117 implements block 412 by modifying parameters such as, for example, a conversion matrix used in embedding (e.g., one or more of matrices A or B in FIG. 3), one or more key vectors of the key matrix, one or more value vectors of the value matrix, a number of nodes in one or more layers of the output section 308, a number of connections between layers of the output section 308, one or more of the weight matrices used in the value-writing section 310, and one or more of the biases used in the value-writing section 310. The method 400 returns to block 406 and performs another iteration using the key-value memory network having one or more modified parameters.

If the MSE has been minimized, the method 400 also involves outputting trained key-value memory network, as depicted at block 414. For example, the training module 117 implements block 414 by making accessible, to the automated modeling system a set of configuration data with parameter values of the key-value memory network, program code implementing functions of the key-value memory network, or both. Examples of making this configuration data or program code available include storing the configuration data or program code in one or more non-transitory computer-readable media that are accessible to the computing hardware 115, transmitting the configuration data or program code to the computing hardware 115 via a network 120, or some combination thereof.

Although FIG. 4 depicts an embodiment in which the minimization of the MSE controls whether subsequent iterations occur, other implementations are possible. For instance, the training module 117 could iteratively perform blocks 402-408 over an entire set of training data (e.g., a set of training data covering a training time period T). At each iteration, the training module 117 could store an associated MSE between a time-series metric prediction and a ground truth value at that iteration, as well as data identifying the parameter values of the key-value network at that iteration. In this alternative embodiment, the training module 117 can, at block 410, compare these stored MSE values to identify the iteration having smallest MSE value. The training module 117 implements block 414 by identifying a configuration of the key-value memory network at that iteration (e.g., the set of key vectors, value vectors, conversion matrices, biases, etc.) and selects that configuration of the key-value memory network for output.

Example of a Computing System for Implementing Certain Embodiments

Figure 5:
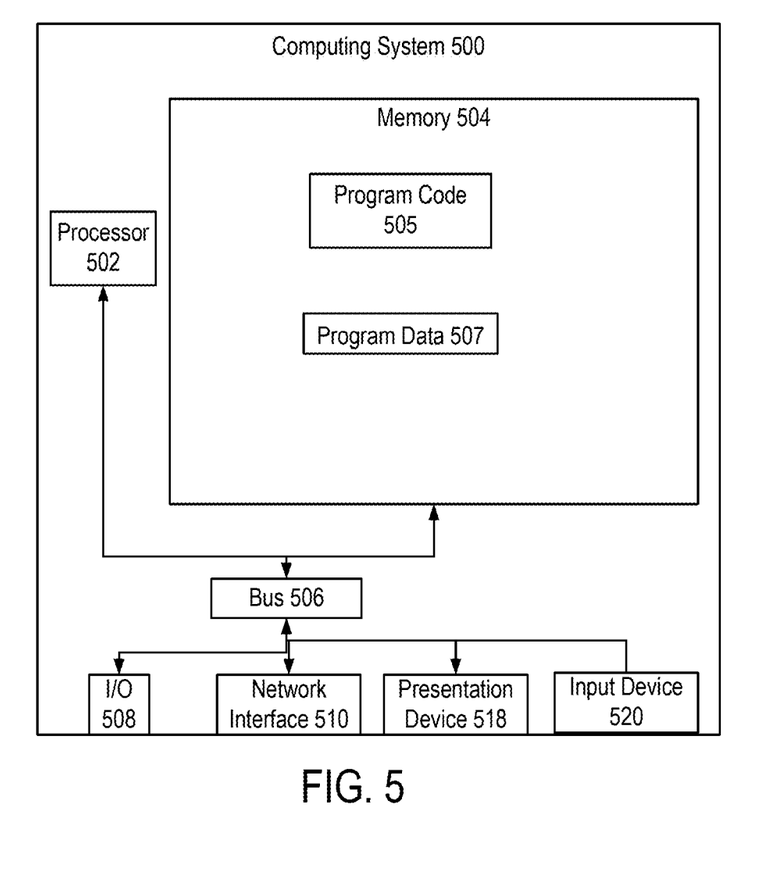
FIG. 5 depicts an example of a computing system that performs certain operations described herein, according to certain embodiments of the present disclosure.

Any suitable computing system or group of computing systems can be used for performing the operations described herein. For example, FIG. 5 depicts examples of computing system 500 that executes a predictive module 116 and a training module 117. In some embodiments, the computing system 500 also executes the host computing system 118, as depicted in FIG. 5. In other embodiments, a separate computing system having devices similar to those depicted in FIG. 5 (e.g., a processor, a memory, etc.) executes the host computing system 118. The depicted examples of a computing system 500 includes a processor 502 communicatively coupled to one or more memory devices 504. The processor 502 executes computer-executable program code stored in a memory device 504, accesses information stored in the memory device 504, or both. Examples of the processor 502 include a microprocessor, an application-specific integrated circuit ("ASIC"), a field-programmable gate array ("FPGA"), or any other suitable processing device. The processor 502 can include any number of processing devices, including a single processing device.

The memory device 504 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions.

The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 500 may also include a number of external or internal devices, such as input or output devices. For example, the computing system 500 is shown with one or more input/output ("I/O") interfaces 508. An I/O interface 508 can receive input from input devices or provide output to output devices. One or more buses 506 are also included in the computing system 500. The bus 506 communicatively couples one or more components of a respective one of the computing system 500.

The computing system 500 executes program code 505 that configures the processor 502 to perform one or more of the operations described herein. The program code 505 includes, for example, the predictive module 116, the training module 117, or other suitable applications that perform one or more operations described herein. The program code 505 may be resident in the memory device 504 or any suitable computer-readable medium and may be executed by the processor 502 or any other suitable processor. In some embodiments, both the predictive module 116 and the training module 117 are stored in the memory device 504, as depicted in FIG. 5. In additional or alternative embodiments, one or more of the predictive module 116 and the training module 117 are stored in different memory devices of different computing systems. In additional or alternative embodiments, the program code 505 described above is stored in one or more other memory devices accessible via a data network.

The computing system 500 can access program data 507, which includes one or more of the datasets described herein (e.g., various types of feature data, configuration data for the key-value memory network, training data, etc.), in any suitable manner. In some embodiments, some or all of one or more of these data sets, models, and functions are stored as the program data 507 in the memory device 504, as in the example depicted in FIG. 5. For example, a computing system 500 that executes the predictive module 116 and the training module 117 can provide access to the trained key-value memory network by an external host computing system 118.

In additional or alternative embodiments, one or more of these data sets, models, and functions are stored in the same memory device (e.g., one of the memory device 504). For example, a common computing system, such as the computing hardware 115 depicted in FIG. 1, can host the predictive module 116 and the training module 117, as well as the key-value memory network predictive model. In additional or alternative embodiments, one or more of the programs, data sets, models, and functions described herein are stored in one or more other memory devices accessible via a data network.

The computing system 500 also includes a network interface device 510. The network interface device 510 includes any device or group of devices suitable for establishing a wired or wireless data connection to one or more data networks. Non-limiting examples of the network interface device 510 include an Ethernet network adapter, a modem, and the like. The computing system 500 is able to communicate with one or more other computing devices (e.g., a host computing system 118) via a data network using the network interface device 510.

In some embodiments, the computing system 500 also includes the input device 520 and the presentation device 518 depicted in FIG. 5. An input device 520 can include any device or group of devices suitable for receiving visual, auditory, or other suitable input that controls or affects the operations of the processor 502. Non-limiting examples of the input device 520 include a touchscreen, a mouse, a keyboard, a microphone, a separate mobile computing device, etc. A presentation device 518 can include any device or group of devices suitable for providing visual, auditory, or other suitable sensory output. Non-limiting examples of the presentation device 518 include a touchscreen, a monitor, a speaker, a separate mobile computing device, etc.

Although FIG. 5 depicts the input device 520 and the presentation device 518 as being local to the computing device that executes the program code 505, other implementations are possible. For instance, in some embodiments, one or more of the input device 520 and the presentation device 518 can include a remote client-computing device that communicates with the computing system 500 via the network interface device 510 using one or more data networks described herein.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

The invention claimed is:

1. A system comprising:
   processing hardware; and
   a non-transitory computer-readable medium communicatively coupled to the processing hardware and implementing a key-value memory network comprising:
   a key matrix with key vectors that are learned from training static feature data and training time-series feature data;
   a value matrix with value vectors representing time-series trends;
   an input layer configured to receive, for a target entity, input data comprising a concatenation of static feature data of the target entity, time-specific feature data, and time-series feature data for the target entity;
   an entity-embedding layer configured to generate an input vector from the input data;
   a key-addressing layer configured to generate a weight vector indicating similarities between the key vectors and the input vector;
   a value-reading layer configured to compute a context vector from the weight vector and the value vectors; and an output layer configured to generate predicted time-series data for a target metric of the target entity by at least applying a continuous activation function to the context vector and the input vector.

2. The system of claim 1, wherein the time-series feature data is a normalized version of input time-series feature data, wherein the processing hardware is configured for:
retrieving, for the target entity, the time-specific feature data identifying a specific time or event with respect to a calendar, the static feature data describing an attribute of the target entity having a value independent of time, and input time-series feature data describing an input metric that is related to the target metric;
normalizing the input time-series feature data based on a normalization scale and thereby generating the time-series feature data; and
generating the input data by concatenating the static feature data, the time-series feature data, and the time-specific feature data.

3. The system of claim 2, wherein the processing hardware is further configured for:
selecting a set of comparative entities based on a comparison of the static feature data to comparative static feature data of the set of comparative entities; and
computing the normalization scale from a combination of (a) a vector of correlation weights and (b) a vector of component normalization scales, wherein each correlation weight indicates a respective correlation between the static feature data and respective comparative static feature data of a respective one of the comparative entities, wherein each component normalization scale is computed from (a) a training time period used for training the key-value memory network and (b) a respective set of time-series feature data for the respective one of the comparative entities.

4. The system of claim 1, further comprising a host computing system configured for:
accessing the predicted time-series data generated by the key-value memory network; and
modifying one or more features of an interactive computing environment operated by the host computing system, wherein the one or more features correspond to the target entity.

5. The system of claim 1, wherein:
the predicted time-series data comprises a predicted value of the target metric for a time step,
the processing hardware is configured for concatenating an observed value of the target metric for the time step, a quantized percentage difference between the observed value and the predicted value, the time-series feature data, and the time-specific feature data, and
the key-value memory network further comprises:
a response embedding layer configured to generate a response embedding vector that represents, with reduced dimensionality, the concatenation of the observed value, the quantized percentage difference, the time-series feature data, and the time-specific feature data,
a section configured for (a) generating, from the response embedding vector, an erase signal indicating data to be removed from the value matrix and an addition signal indicating data to be added to the value matrix and (b) modifying the value matrix based on the erase signal and the addition signal.

6. The system of claim 5, wherein the processing hardware is further configured for generating, for an additional time step, additional predicted time-series data for the target metric of the target entity by applying the key-value memory network having the modified value matrix to an additional set of input data.

7. The system of claim 1, wherein the continuous activation function comprises a rectified linear unit.

8. A method comprising:
receiving, by a processing device for a target entity input data comprising a concatenation of static feature data of the target entity, time-specific feature data, and time-series feature data for the target entity;
generating, by the processing device, predicted time-series data for a target metric of the target entity by applying a key-value memory network to the input data, the key-value memory network comprising:
a key matrix with key vectors that are learned from training static feature data and training time-series feature data;
a value matrix with value vectors representing time-series trends;
an input layer configured to receive the input data for the target entity;
an entity-embedding layer configured to generate an input vector from the input data;
a key-addressing layer configured to generate a weight vector indicating similarities between the key vectors and the input vector;
a value-reading layer configured to compute a context vector from the weight vector and the value vectors; and
an output layer configured to generate the predicted time-series data for the target metric of the target entity by at least applying a continuous activation function to the context vector and the input vector.

9. The method of claim 8, wherein the time-series feature data is a normalized version of input time-series feature data, and further comprising:
retrieving, by the processing device for the target entity, the time-specific feature data identifying a specific time or event with respect to a calendar, the static feature data describing an attribute of the target entity having a value independent of time, and input time-series feature data describing an input metric that is related to the target metric;
normalizing, by the processing device, the input time-series feature data based on a normalization scale and thereby generating the time-series feature data; and
generating, by the processing device, the input data by concatenating the static feature data, the time-series feature data, and the time-specific feature data.

10. The method of claim 9, further comprising:
selecting, by the processing device, a set of comparative entities based on a comparison of the static feature data to comparative static feature data of the set of comparative entities; and
computing, by the processing device, the normalization scale from a combination of (a) a vector of correlation weights and (b) a vector of component normalization scales, wherein each correlation weight indicates a respective correlation between the static feature data and respective comparative static feature data of a respective one of the comparative entities, wherein each component normalization scale is computed from (a) a training time period used for training the key-value memory network and (b) a respective set of time-series feature data for the respective one of the comparative entities.

11. The method of claim 8, further comprising:
accessing, by the processing device, the predicted time-series data generated by the key-value memory network; and
modifying, by the processing device, one or more features of an interactive computing environment operated by a host computing system, wherein the one or more features correspond to the target entity.

12. The method of claim 8, wherein the predicted time-series data comprises a predicted value of the target metric for a time step, and further comprising concatenating, by the processing device, an observed value of the target metric for the time step, a quantized percentage difference between the observed value and the predicted value, the time-series feature data, and the time-specific feature data, and wherein the key-value memory network further comprises:
a response embedding layer configured to generate a response embedding vector that represents, with reduced dimensionality, the concatenation of the observed value, the quantized percentage difference, the time-series feature data, and the time-specific feature data, and
a section configured for (a) generating, from the response embedding vector, an erase signal indicating data to be removed from the value matrix and an addition signal indicating data to be added to the value matrix and (b) modifying the value matrix based on the erase signal and the addition signal.

13. The method of claim 12, further comprising generating, by the processing device for an additional time step, additional predicted time-series data for the target metric of the target entity by applying the key-value memory network having the modified value matrix to an additional set of input data.

14. The method of claim 9, wherein the continuous activation function comprises a rectified linear unit.

15. A non-transitory computer readable medium storing computer readable program instructions, that when executed by one or more processing devices, cause the one or more processing devices to perform operations comprising:
receiving, for a target entity input data comprising a concatenation of static feature data of the target entity, time-specific feature data, and time-series feature data for the target entity;
generating predicted time-series data for a target metric of the target entity by applying a key-value memory network to the input data, the key-value memory network comprising:
a key matrix with key vectors that are learned from training static feature data and training time-series feature data;
a value matrix with value vectors representing time-series trends;
an input layer configured to receive the input data for the target entity;
an entity-embedding layer configured to generate an input vector from the input data;
a key-addressing layer configured to generate a weight vector indicating similarities between the key vectors and the input vector;
a value-reading layer configured to compute a context vector from the weight vector and the value vectors; and
an output layer configured to generate the predicted time-series data for the target metric of the target entity by at least applying a continuous activation function to the context vector and the input vector.

16. The non-transitory computer-readable medium of claim 15, wherein the time-series feature data is a normalized version of input time-series feature data, the operations further comprising:
retrieving, for the target entity, the time-specific feature data identifying a specific time or event with respect to a calendar, the static feature data describing an attribute of the target entity having a value independent of time, and input time-series feature data describing an input metric that is related to the target metric;
normalizing the input time-series feature data based on a normalization scale and thereby generating the time-series feature data; and
generating the input data by concatenating the static feature data, the time-series feature data, and the time-specific feature data.

17. The non-transitory computer-readable medium of claim 16, the operations further comprising:
selecting a set of comparative entities based on a comparison of the static feature data to comparative static feature data of the set of comparative entities; and
computing the normalization scale from a combination of (a) a vector of correlation weights and (b) a vector of component normalization scales, wherein each correlation weight indicates a respective correlation between the static feature data and respective comparative static feature data of a respective one of the comparative entities, wherein each component normalization scale is computed from (a) a training time period used for training the key-value memory network and (b) a respective set of time-series feature data for the respective one of the comparative entities.

18. The non-transitory computer-readable medium of claim 15, the operations further comprising:
accessing the predicted time-series data generated by the key-value memory network; and
modifying one or more features of an interactive computing environment operated by the host computing system, wherein the one or more features correspond to the target entity.

19. The non-transitory computer-readable medium of claim 15, wherein the predicted time-series data comprises a predicted value of the target metric for a time step, wherein the operations further comprise concatenating an observed value of the target metric for the time step, a quantized percentage difference between the observed value and the predicted value, the time-series feature data, and the time-specific feature data, and wherein the key-value memory network further comprises:
a response embedding layer configured to generate a response embedding vector that represents, with reduced dimensionality, the concatenation of the observed value, the quantized percentage difference, the time-series feature data, and the time-specific feature data, and
a section configured for (a) generating, from the response embedding vector, an erase signal indicating data to be removed from the value matrix and an addition signal indicating data to be added to the value matrix and (b) modifying the value matrix based on the erase signal and the addition signal.

20. The non-transitory computer-readable medium of claim 19, the operations further comprising generating, for an additional time step, additional predicted time-series data for the target metric of the target entity by applying the key-value memory network having the modified value matrix to an additional set of input data.

* * * * *